United States Patent
Cheng et al.

(10) Patent No.: US 6,689,643 B2
(45) Date of Patent: Feb. 10, 2004

(54) ADJUSTABLE 3D CAPACITOR

(75) Inventors: Wei Hua Cheng, Singapore (SG); Daniel Yen, Singapore (SG); Chit Hwei Ng, Singapore (SG); Marvin Liao, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/132,337

(22) Filed: Apr. 25, 2002

(65) Prior Publication Data

US 2003/0201476 A1 Oct. 30, 2003

(51) Int. Cl.$^7$ .......................... H01L 21/82; H01L 21/20
(52) U.S. Cl. ...................... 438/130; 438/240; 438/387; 438/396; 438/666
(58) Field of Search ................................ 438/131, 132, 438/240, 244, 253, 387, 396, 600, 601, 652, 656, 666, 130

(56) References Cited

U.S. PATENT DOCUMENTS

| | | | |
|---|---|---|---|
| 5,172,201 A | * 12/1992 | Suizu | 257/303 |
| 5,350,705 A | 9/1994 | Brassington et al. | 257/295 |
| 5,604,145 A | 2/1997 | Hashizume et al. | 437/52 |
| 5,744,385 A | 4/1998 | Hojabri | 438/238 |
| 5,913,126 A | * 6/1999 | Oh et al. | 438/393 |
| 6,088,258 A | 7/2000 | Aitken et al. | 365/149 |
| 6,255,161 B1 | * 7/2001 | Lin | 438/254 |
| 6,268,620 B1 | * 7/2001 | Ouellet et al. | 257/301 |
| 6,281,541 B1 | * 8/2001 | Hu | 257/306 |
| 6,391,707 B1 | * 5/2002 | Dirnecker et al. | 438/250 |
| 6,461,911 B2 | * 10/2002 | Ahn et al. | 438/253 |
| 6,630,380 B1 | * 10/2003 | Joy et al. | 438/253 |

OTHER PUBLICATIONS

Wolf, Ph.D., Stanley, "Multlevel–Interconnect Technology for VLSI and ULSI," Silicon Processing for the VLSI Era—vol. 2: Process Integration, Lattice Press (1990), pp. 189–190, 194–199.*

* cited by examiner

Primary Examiner—Amir Zarabian
Assistant Examiner—Toniae M. Thomas
(74) Attorney, Agent, or Firm—George O. Saile; Rosemary L. S. Pike

(57) ABSTRACT

There is a need for adjustable capacitors for use in LC or RC matching networks in micro-circuits. This has been achieved by forming a set of individual capacitors that share a common bottom electrode. The areas of the top electrodes of these individual capacitors are chosen to be in an integral ratio to one another so that they can be combined to produce any capacitance within a range of unit values. For example, if four capacitors whose areas are in the ratio of 5:2:1:1, are provided, then any capacitance in a range of from 1 to 9 can be generated, depending on how the top electrodes are connected. Such connections can be hard-wired within the final wiring level to provide a factory adjustable capacitor or they can be connected through field programmable devices to produce a field programmable capacitor. A process for manufacturing the device is also described.

13 Claims, 2 Drawing Sheets

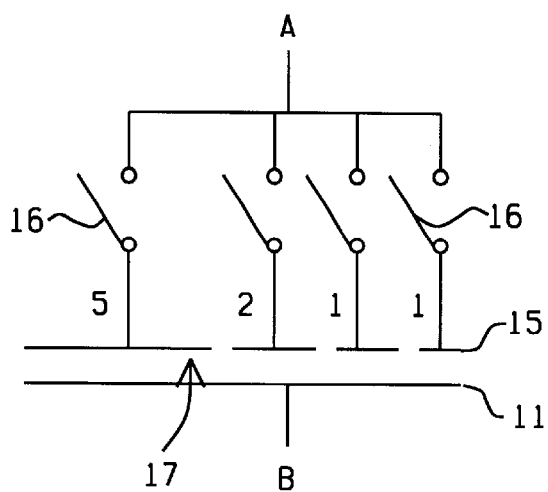
FIG. 1 – Prior Art
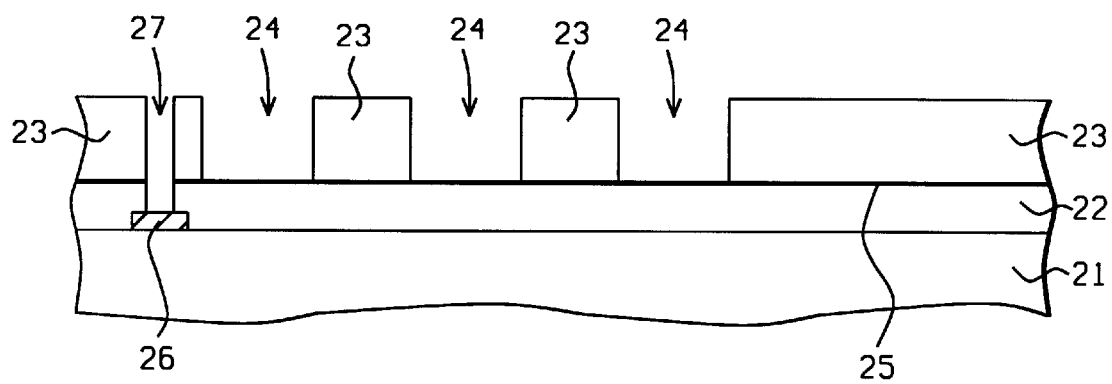
FIG. 2
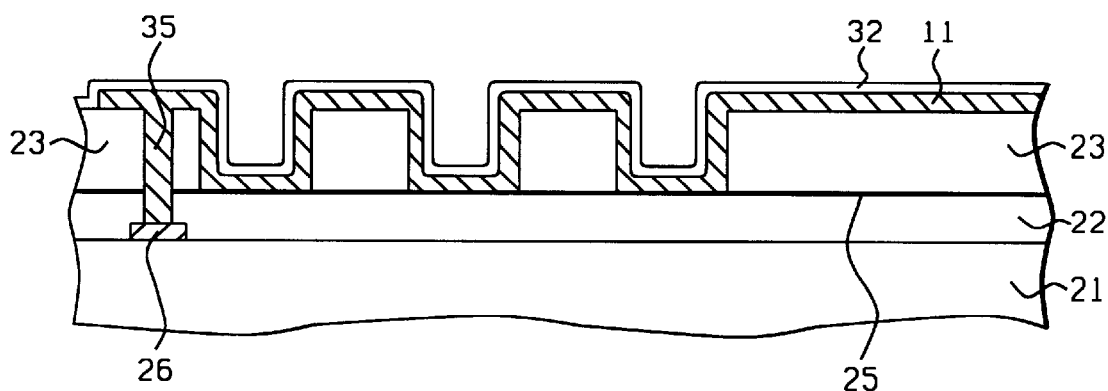
FIG. 3

ADJUSTABLE 3D CAPACITOR

FIELD OF THE INVENTION

The invention relates to the general field of integrated circuits with particular reference to variable capacitors occupying minimum chip real estate.

BACKGROUND OF THE INVENTION

LC or RC matching of networks is critical for some analog or RF circuits. Adjustment of capacitor values after the circuits are already in use is not possible. Once the capacitor value has been pre-set, subsequent fine tuning is not possible and an entirely new mask is needed for the capacitor portions of the circuit. Additionally, conventional flat capacitor designs tend to occupy large amounts of chip real estate, acting as a bottleneck for further circuit densification.

In the pre-integrated circuit era, one of the ways of providing an adjustable capacitor was the layout schematically shown in FIG. 1. Seen there are four top electrodes 15 that share a common lower electrode 11. By means of switches 16 the top electrodes can be connected in parallel, as needed to provide a capacitance value between 1 and 9 units between points A and B since, as can be seen, the ratios of the individual top electrode areas are 5:2:1:1.

The present invention discloses how the schematic circuit of FIG. 1 can be implemented in an integrated circuit, with minimum consumption of chip real estate.

A routine search of the prior art was performed with the following references of interest being found:

In U.S. Pat. No. 5,350,705, Brassington et al. show a flat capacitor arrangement with common top plate. Aitken et al. in U.S. Pat. No. 6,088,258 shows a planarized interweave capacitor. In U.S. Pat. No. 5,604,145, Hashizume et al. disclose a planar capacitor process while in U.S. Pat. No. 5,744,385, Hojabri reveals a compensation technique for a parasitic capacitor.

SUMMARY OF THE INVENTION

It has been an object of at least one embodiment of the present invention to provide a capacitor for use in micro-electronic circuits.

Another object of at least one embodiment of the present invention has been that said capacitor be adjustable at the time that said micro-electronic circuits are being manufactured.

Still another object of at least one embodiment of the present invention has been that said capacitor be adjustable at the time that said micro-electronic circuits are being used in the field.

A further object of at least one embodiment of the present invention has been to provide a process for manufacturing said adjustable capacitor.

These objects have been achieved by forming a set of individual capacitors that share a common bottom electrode. The areas of the top electrodes of these individual capacitors are chosen to be in an integral ratio to one another so that they can be combined to produce any capacitance within a range of unit values. For example, if four capacitors whose areas are in the ratio of 5:2:1:1, are provided, then any capacitance in a range of from 1 to 9 can be generated, depending on how the top electrodes are connected. Such connections can be hard-wired within the final wiring level to provide a factory adjustable capacitor or they can be connected through field programmable devices to produce a field programmable capacitor.

BRIEF DESCRIPTION OF THE DRAWINGS

FIG. 1 shows how a group of capacitors can be connected to provide a wide range of capacitances.

FIG. 2 shows the starting point for the process of the present invention.

FIGS. 3 and 4 shows how several micro-capacitors may be formed without using up too much chip real estate.

DESCRIPTION OF THE PREFERRED EMBODIMENTS

Figure 4:
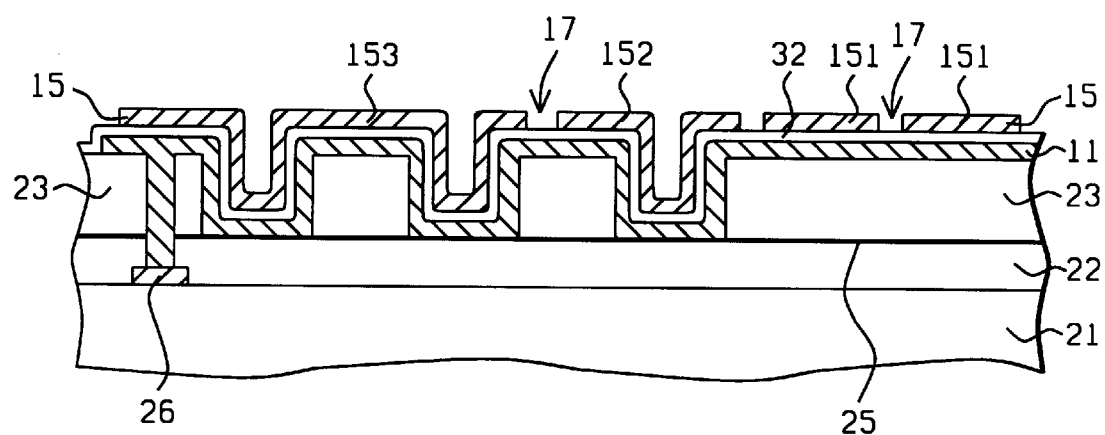

We will disclose the present invention through a description of the process of the present invention. In the course of so doing, the structure of the present invention will also become apparent.

Referring now to FIG. 2, the process of the present invention begins with the provision of suitable substrate 21 on which is already present (or is to be added) an electrical circuit of some kind including contact pads, such as 26, to which a capacitor is to be connected. Most commonly, though not necessarily exclusively, this will be the topmost layer of an integrated circuit on a silicon wafer.

A base dielectric layer 22 is then deposited onto 21 and contact pad 26. Layer 22 could be any of several materials such as silicon oxide, TEOS (tetraethyl orthosilicate), or black diamond (methyl-doped porous silica), with any material having a low dielectric constant being preferred, and it is deposited to a thickness between about 1,000 and 10,000 Angstroms, with 2,000 being typical. This is followed by laying down etch stop layer 25 on layer 22. This layer is typically silicon nitride, but other materials such as silicon carbide could also have been used. It is deposited to a thickness between about 10 and 1,000 Angstroms following which second dielectric layer 23 is deposited on it. We will refer to layer 23 as a support dielectric layer.

We have usually used an oxide such as silicon oxide or TEOS for the support dielectric layer but other materials such as black diamond or silicon carbide could also have been used. It is deposited to a thickness between about 1,000 and 5,000 microns. Next, via hole 27 is etched through support dielectric layer 23 as well as etch stop layer 25 and base dielectric layer 22, thereby exposing contact pad 26.

After deposition of a barrier layer (not shown) in via hole 27 it is overfilled with tungsten and then planarized so as to remove all tungsten not inside via 27, resulting in the formation of tungsten via 35 (FIG. 3). Then, as seen in FIG. 2, three trenches 24, that extend through layer 23 as far as etch stop layer 25, are etched. The presence of layer 25 ensures that all trenches have exactly the same depth. Each trench has a width between about 0.1 and 0.8 microns and the trenches are separated from one another by between about 0.1 and 1 microns, depending on technology design rules.

Referring now to FIG. 3, metal layer 11 is then deposited over the surface of layer 23, using a conformal deposition method such as PECVD (plasma enhanced chemical vapor deposition) to ensure that its thickness is uniform everywhere, including the floors and walls of the trenches.

Our preferred metal for layer 11 has been Al, but other metals such as Ti or TiN could also have been used. Layer 11 is deposited to a thickness between about 100 and 3,000 Angstroms and is then patterned to form a common capacitor electrode (see FIG. 1) that is in contact with tungsten via 35.

This is followed by the deposition of high dielectric constant material layer 32 on common capacitor electrode 11 and then patterning layer 32 to make sure that it fully overlaps common capacitor electrode 11. Examples of layer 32 material include, but are not limited to, silicon nitride, tantalum oxide, hafnium oxide, and aluminum oxide. It was deposited to a thickness between about 30 and 300 Angstroms.

We refer now to FIG. 4. Metal layer 15 is deposited on high dielectric constant layer 32 and then patterned to form four unconnected top electrodes 151, 152, and 155, all of whom are overlapped by common electrode 11. These correspond to the four capacitors marked 1, 1, 2, and 5 shown schematically in FIG. 1 so their relative areas are arranged to be in the ratio 1:1:2:5. Materials and thicknesses for layer 15 are similar to what was used for layer 11.

Figure 5:
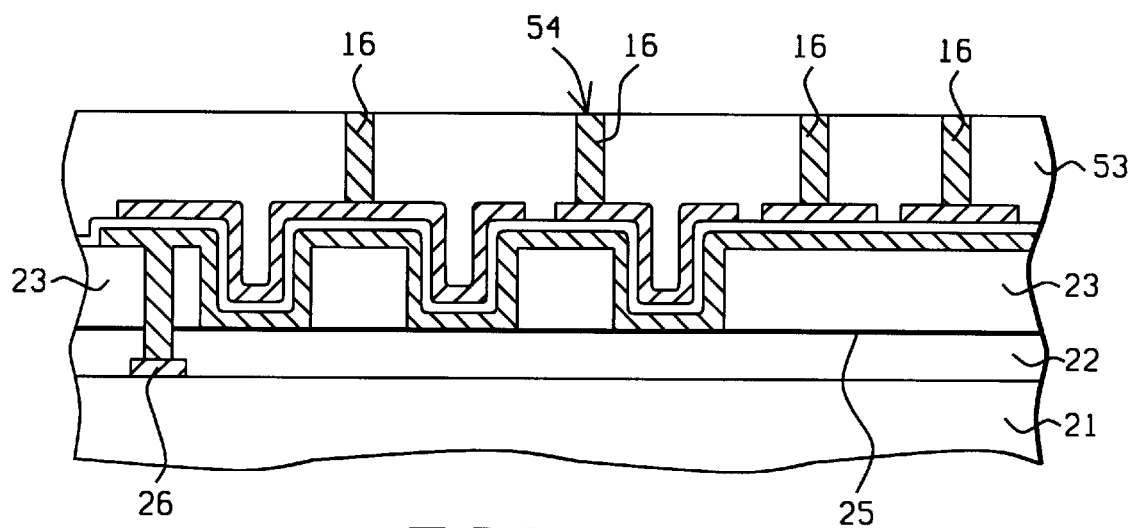
FIG. 5 shows how connections are made to the individual capacitors.

Referring next to FIG. 5, top dielectric layer 53 is then deposited on layer 15 (as well as any exposed parts of layer 32) and four via holes 16 are etched through layer 23 so as to expose contact area for each of top electrodes 151, 152, and 155. Via holes 16 are then filled with tungsten as already described above so as to provide contacts such as 54 for connection to the capacitor top plates.

Figure 6:
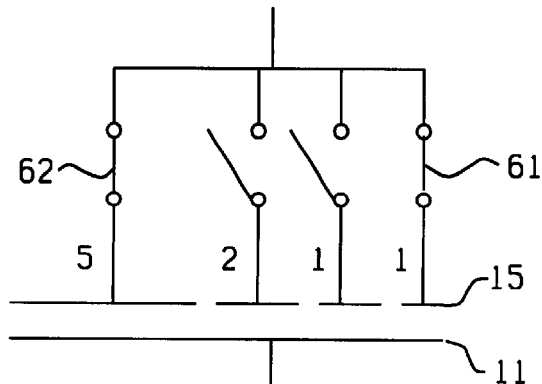
FIG. 6 shows the circuit of FIG. 1 modified to produce a specific capacitance value.

The process of the present invention concludes by describing two possible embodiments that differ in how final connections are made to the capacitor top electrodes. For example, to provide a capacitor having a value of 6 units of capacitance, connections 61 and 62 need to be closed, as shown in FIG. 6.

In a first embodiment a metal layer (not shown) is laid down on layer 23 and then patterned to make permanent (hard-wired) connections to electrode 155 and either of the electrodes 151. In a second embodiment, a contact wire (not shown) is provided near each contact, such as 54, and then connected to it through a field programmable device. This results in a field programmable capacitor whose value can be adjusted at the time that it is needed in the field. Examples of possible field programmable devices include fusible links, anti-fuses, resistors, capacitors, and pass transistors.

We conclude our description of the present invention by noting that we have elected to vary capacitance values by introducing differences in area. This could also have been accomplished by use of more than one dielectric film thickness, by use of more than one dielectric material (each having different dielectric constants), or by any combination of these three possibilities.

What is claimed is:

1. A process for forming an adjustable capacitor, comprising:

providing a silicon wafer having a topmost layer on which are contact pads connected to a circuit contained in said wafer;

depositing a base dielectric layer on said topmost layer, including said contact pads;

on said base dielectric layer, depositing an etch stop layer, selected from the group consisting of silicon nitride and silicon carbide, to a thickness between about 20 and 500 microns;

depositing a support dielectric layer on said etch stop layer;

etching a via hole through said support dielectric layer, said etch stop layer, and said base dielectric layer, thereby exposing said contact pad;

depositing a barrier layer in said via hole, then overfilling said via hole with tungsten and then planarizing so as to remove all tungsten not inside said via;

etching three trenches that extend through said support dielectric layer as far as said etch stop layer;

depositing a first layer of metal on said support dielectric layer, including inside said trenches, and then patterning said first metal layer to form a common capacitor electrode that contacts said tungsten-filled via hole;

depositing a layer of high dielectric constant material on said common capacitor electrode and then patterning said high dielectric constant layer whereby it fully overlaps said common capacitor electrode;

depositing a second layer of metal on said high dielectric constant layer and then patterning said second metal layer to form four unconnected top electrodes, all of whom are overlapped by said common electrode, said top electrodes having, relative to one another, areas in the ratio 5:2:1:1;

depositing a top dielectric layer on said top electrodes and said high dielectric constant layer;

etching four via holes through said top dielectric layer whereby a contact area is exposed for each of said top electrodes;

depositing a barrier layer in said via holes, then overfilling said via holes with tungsten and then planarizing so as to remove all tungsten not inside said via holes; and then depositing and patterning a third metal layer so as to provide permanent connections between said top electrodes, thereby giving said adjustable capacitor a specific capacitance value.

2. The process described in claim 1 wherein said base dielectric layer is selected from the group consisting of silicon oxide, TEOS, black diamond, and all dielectrics having a dielectric constant less than about 5 and said base dielectric layer is deposited to a thickness between about 200 and 5,000 Angstroms.

3. The process described in claim 1 wherein said support dielectric layer is selected from the group consisting of silicon oxide, black diamond, and all dielectrics having a dielectric constant less than about 5 and said support dielectric layer is deposited to a thickness between about 200 and 5,000 Angstroms.

4. The process described in claim 1 wherein said metal layers are selected from the group consisting of Al, Ti, TiN, and all metals whose resistivity is less than about 5 microhm-cm, and are deposited to a thickness between about 200 and 5,000 Angstroms.

5. The process described in claim 1 wherein said layer of high dielectric constant material is selected from the group consisting of silicon nitride, tantalum oxide, aluminum oxide, and hafnium oxide and is deposited to a thickness between about 20 and 500 Angstroms.

6. The process described in claim 1 wherein each trench has a width between about 0.1 and 0.8 microns and said trenches are separated from one another by between about 0.1 and 0.8 microns.

7. A process for forming a field programmable capacitor, comprising:

providing a silicon wafer having a topmost layer on which are contact pads connected to a circuit contained in said wafer;

depositing a base dielectric layer on said topmost layer, including said contact pads;

on said base dielectric layer, depositing an etch stop layer, selected from the group consisting of silicon nitride and silicon carbide, to a thickness between about 20 and 500 microns;

depositing a support dielectric layer on said etch stop layer;

etching a via hole through said support dielectric layer, said etch stop layer, and said base dielectric layer, thereby exposing said contact pad;

depositing a barrier layer in said via hole, then overfilling said via hole with tungsten and then planarizing so as to remove all tungsten not inside said via;

etching three trenches that extend through said support dielectric layer as far as said etch stop layer;

depositing a first layer of metal on said support dielectric layer, including inside said trenches, and then patterning said first metal layer to form a common capacitor electrode that contacts said tungsten-filled via hole;

depositing a layer of high dielectric constant material on said common capacitor electrode and then patterning said high dielectric constant layer whereby it fully overlaps said common capacitor electrode;

depositing a second layer of metal on said high dielectric constant layer and then patterning said second metal layer to form four unconnected top electrodes, all of whom are overlapped by said common electrode, said top electrodes having, relative to one another, areas in the ratio 5:2:1:1;

depositing a top dielectric layer on said top electrodes and said high dielectric constant layer;

etching four via holes through said top dielectric layer whereby a contact area is exposed for each of said top electrodes;

depositing a barrier layer in said via holes, then overfilling said via holes with tungsten and then planarizing so as to remove all tungsten not inside said via holes; and then depositing and patterning a third metal layer to form a contact wire for each of said filled via holes; and connecting said contacting wires to each other through field programmable devices, thereby forming said field programmable capacitor.

8. The process described in claim 7 wherein said field programmable devices are selected from the group consisting of fusible links, anti-fuses, pass transistors, resistors, and capacitors.

9. The process described in claim 7 wherein said base dielectric layer is selected from the group consisting of silicon oxide, black diamond, and all dielectrics having a dielectric constant less than about 5 and said base dielectric layer is deposited to a thickness between about 200 and 5,000 Angstroms.

10. The process described in claim 7 wherein said support dielectric layer is selected from the group consisting of silicon oxide, black diamond, and all dielectrics having a dielectric constant less than about 5 and said support dielectric layer is deposited to a thickness between about 200 and 5,000 Angstroms.

11. The process described in claim 7 wherein said metal layers are selected from the group consisting of Al, Ti, TiN, and all metals whose resistivity is less than about 5 microhm-cm, and are deposited to a thickness between about 200 and 5,000 Angstroms.

12. The process described in claim 7 wherein said layer of high dielectric constant material is selected from the group consisting of silicon nitride, tantalum oxide, aluminum oxide, and hafnium oxide and is deposited to a thickness between about 20 and 500 Angstroms.

13. The process described in claim 7 wherein each trench has a width between about 0.1 and 0.8 microns and said trenches are separated from one another by between about 0.1 and 0.8 microns.

* * * * *